US011483948B2

(12) United States Patent
Strader et al.

(10) Patent No.: US 11,483,948 B2
(45) Date of Patent: Oct. 25, 2022

(54) THERMAL INTERFACE MATERIALS INCLUDING MEMORY FOAM CORES

(71) Applicant: Laird Technologies, Inc., Chesterfield, MO (US)

(72) Inventors: Jason L. Strader, Cleveland, OH (US); Kyle Burke Huffstutler, Chesterfield, MO (US); Eric Edward Trantina, Belmont, CA (US)

(73) Assignee: Laird Technologies, Inc., Chesterfield, MO (US)

( * ) Notice: Subject to any disclaimer, the term of this patent is extended or adjusted under 35 U.S.C. 154(b) by 212 days.

(21) Appl. No.: 17/001,815

(22) Filed: Aug. 25, 2020

(65) Prior Publication Data

US 2021/0068304 A1 Mar. 4, 2021

Related U.S. Application Data

(60) Provisional application No. 62/893,691, filed on Aug. 29, 2019, provisional application No. 62/893,129, filed on Aug. 28, 2019.

(51) Int. Cl.
*H05K 7/20* (2006.01)
*F28F 21/02* (2006.01)
*F28F 13/00* (2006.01)

(52) U.S. Cl.
CPC ....... *H05K 7/20454* (2013.01); *F28F 13/003* (2013.01); *F28F 21/02* (2013.01)

(58) Field of Classification Search
None
See application file for complete search history.

(56) References Cited

U.S. PATENT DOCUMENTS

| 4,563,375 | A  | 1/1986  | Ulrich          |
| 5,902,956 | A  | 5/1999  | Spies et al.    |
| 6,075,205 | A  | 6/2000  | Zhang           |
| 6,097,598 | A  | 8/2000  | Miyahara et al. |
| 6,241,005 | B1 | 6/2001  | Risca           |
| 6,309,742 | B1 | 10/2001 | Clupper et al.  |
| 6,410,137 | B1 | 6/2002  | Bunyan          |
| 6,477,061 | B1 | 11/2002 | Johnson         |
| 6,482,520 | B1 | 11/2002 | Tzeng           |
| 6,521,348 | B2 | 2/2003  | Bunyan et al.   |
| 6,777,086 | B2 | 8/2004  | Norley et al.   |
| 6,784,363 | B2 | 8/2004  | Jones           |
| 6,835,453 | B2 | 12/2004 | Greenwood et al.|
| 7,161,809 | B2 | 1/2007  | Ford et al.     |
| 7,166,912 | B2 | 1/2007  | Tzeng et al.    |

(Continued)

FOREIGN PATENT DOCUMENTS

| CN | 103797903 A | 5/2014 |
| CN | 106753018 A | 5/2017 |

(Continued)

*Primary Examiner* — Courtney L Smith
(74) *Attorney, Agent, or Firm* — Harness, Dickey & Pierce, P.L.C.; Anthony G. Fussner

(57) ABSTRACT

Disclosed herein are thermal interface materials (TIMs) including memory foam cores. In an exemplary embodiment, a thermal interface material generally includes a memory foam core including a plurality of sides defining a perimeter. A heat spreader is disposed at least partially around the perimeter defined by the plurality of sides of the memory foam core.

20 Claims, 8 Drawing Sheets

(56) References Cited

U.S. PATENT DOCUMENTS

| | | |
|---|---|---|
| 7,292,441 B2 | 11/2007 | Smalc et al. |
| 7,303,820 B2 | 12/2007 | Capp et al. |
| 7,306,847 B2 | 12/2007 | Capp et al. |
| 7,375,291 B2 | 5/2008 | Ariel |
| 7,473,855 B2 | 1/2009 | Rutherford et al. |
| 7,494,712 B2 | 2/2009 | Norley et al. |
| 7,763,810 B2 | 7/2010 | van Haaster |
| 7,889,502 B1 | 2/2011 | Reis et al. |
| 8,217,512 B1 | 7/2012 | Carlson et al. |
| 8,223,986 B2 | 7/2012 | Sander et al. |
| 8,270,170 B2 * | 9/2012 | Hughes .............. H05K 7/20318 361/679.52 |
| 8,477,499 B2 * | 7/2013 | Hill .................... H05K 7/2039 361/818 |
| 9,067,287 B2 | 6/2015 | Ofoma et al. |
| 9,335,104 B2 | 5/2016 | Oh et al. |
| 9,389,029 B2 | 7/2016 | Chowdhury et al. |
| 9,445,528 B2 | 9/2016 | Cohen et al. |
| 9,968,004 B2 * | 5/2018 | Khorrami ............. H01P 1/201 |
| 10,046,536 B2 | 8/2018 | Jang |
| 10,104,809 B2 | 10/2018 | Ofoma et al. |
| 2004/0032710 A1 | 2/2004 | Fujiwara et al. |
| 2005/0061474 A1 | 3/2005 | Gelorme et al. |
| 2006/0180348 A1 | 8/2006 | Cloutier et al. |
| 2006/0225874 A1 | 10/2006 | Shives et al. |
| 2006/0272855 A1 | 12/2006 | Rutherford et al. |
| 2007/0052125 A1 | 3/2007 | Kalinoski et al. |
| 2010/0142154 A1 | 6/2010 | Collet et al. |
| 2012/0033384 A1 | 2/2012 | Pillai |
| 2012/0061135 A1 * | 3/2012 | Hill .................... H05K 9/009 174/388 |
| 2012/0063103 A1 | 3/2012 | Kirk |
| 2013/0047435 A1 | 2/2013 | Ofoma et al. |
| 2013/0048262 A1 | 2/2013 | Ofoma et al. |
| 2014/0332193 A1 | 11/2014 | Oh et al. |
| 2015/0118482 A1 | 4/2015 | Kagawa |
| 2015/0301568 A1 | 10/2015 | Hill et al. |
| 2016/0004284 A1 * | 1/2016 | Cohen .................... G06F 1/203 156/185 |
| 2017/0150651 A1 | 5/2017 | Hartman et al. |
| 2017/0367221 A1 * | 12/2017 | Ofoma ............... H05K 7/20445 |
| 2018/0034492 A1 | 2/2018 | Edgren et al. |
| 2018/0035529 A1 | 2/2018 | Arai et al. |
| 2018/0177074 A1 | 6/2018 | Wu |
| 2018/0199460 A1 | 7/2018 | Wu |
| 2018/0366795 A1 | 12/2018 | Chi et al. |
| 2019/0014691 A1 | 1/2019 | Ofoma et al. |
| 2019/0040954 A1 | 2/2019 | Wei et al. |

FOREIGN PATENT DOCUMENTS

| | | |
|---|---|---|
| CN | 107105604 A | 8/2017 |
| CN | 206562400 U | 10/2017 |
| EP | 1680274 A2 | 7/2006 |
| EP | 1779713 A2 | 5/2007 |
| EP | 1875790 A2 | 1/2008 |
| GB | 2545212 A | 6/2017 |
| JP | 2007184392 A | 7/2007 |
| KR | 20090028283 A | 3/2009 |
| KR | 100953679 B1 | 4/2010 |
| KR | 20120083926 A | 7/2012 |
| KR | 101243647 B1 | 3/2013 |
| KR | 101245164 B1 | 3/2013 |
| KR | 101256397 B1 | 4/2013 |
| WO | WO-2001010182 A2 | 2/2001 |
| WO | WO-2001024596 A1 | 4/2001 |
| WO | WO-20130048262 A1 | 4/2013 |
| WO | WO-2018149512 A1 | 8/2018 |

\* cited by examiner

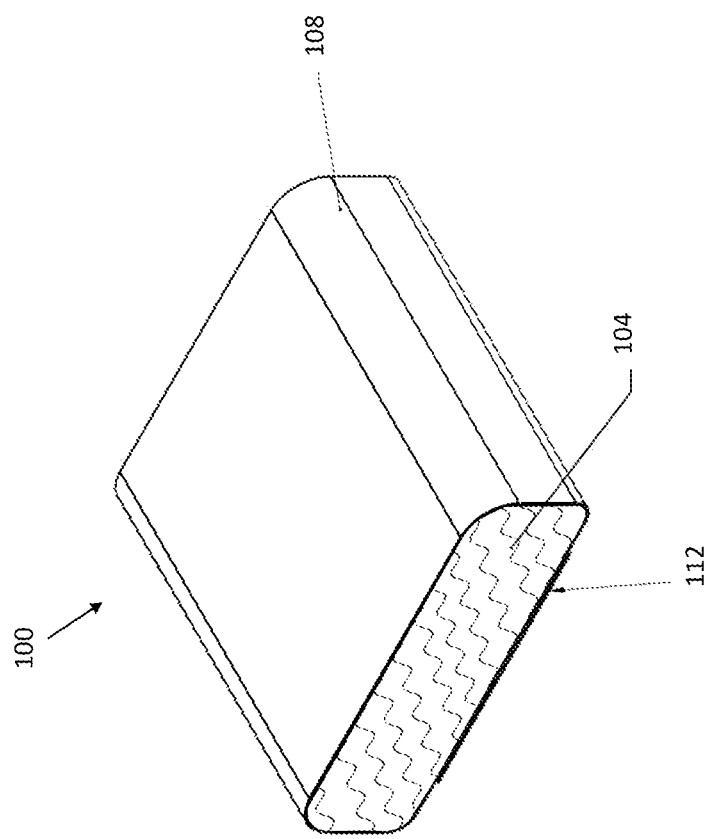
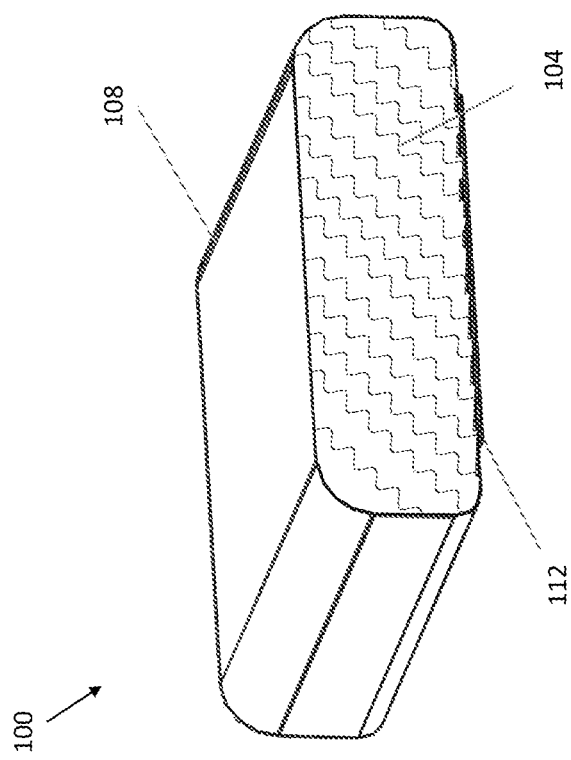

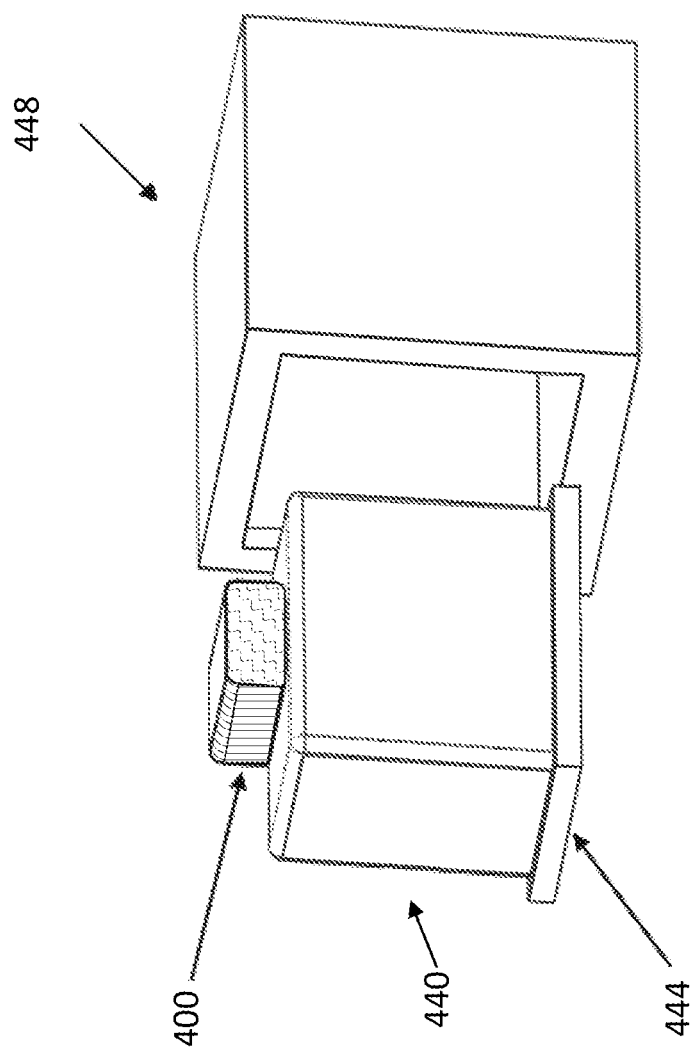

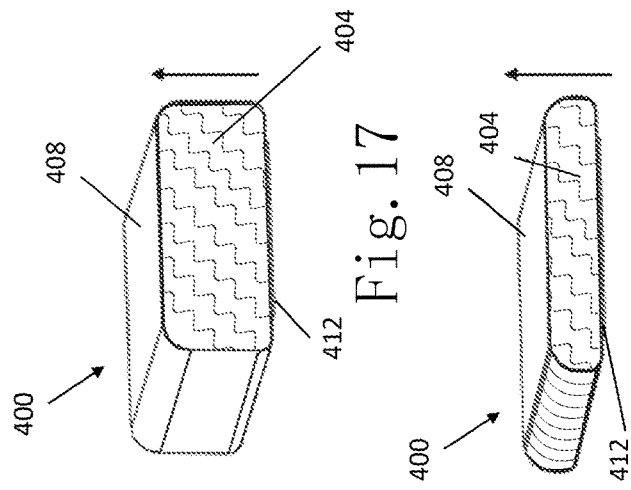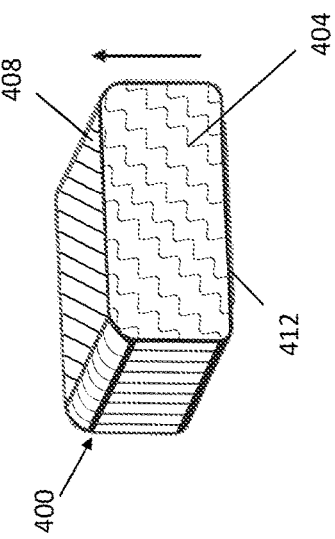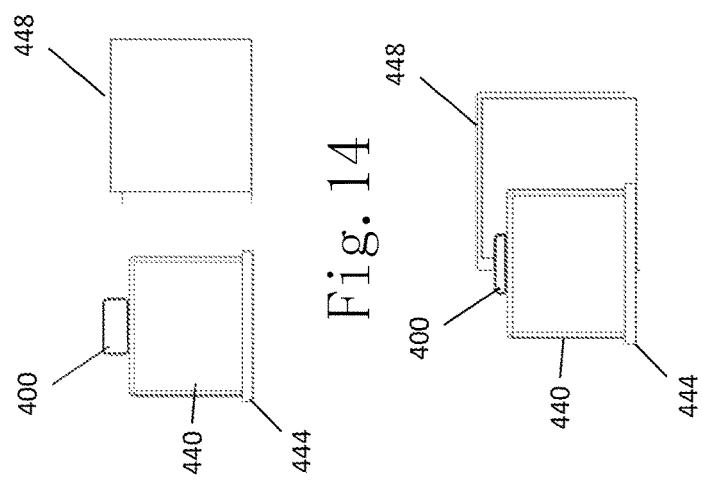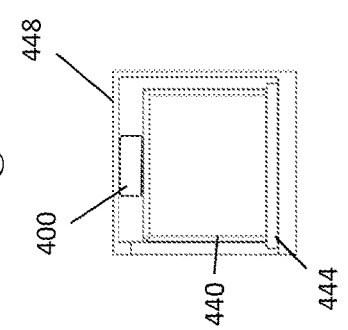

THERMAL INTERFACE MATERIALS INCLUDING MEMORY FOAM CORES

CROSS-REFERENCE TO RELATED APPLICATIONS

This application claims priority to and the benefit of U.S. Provisional Patent Application No. 62/893,129 filed Aug. 28, 2019 and U.S. Provisional Patent Application No. 62/893,691 filed Aug. 29, 2019. The entire disclosures of the above applications are incorporated herein by reference.

FIELD

The present disclosure relates to thermal interface materials (TIMs) including memory foam cores.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

DRAWINGS

The drawings described herein are for illustrative purposes only of selected embodiments and not all possible implementations, and are not intended to limit the scope of the present disclosure.

FIGS. 1 and 2 are perspective views of an exemplary embodiment of a thermal interface material (TIM) including a memory foam core, graphite wrapped around the memory foam core, and pressure sensitive adhesive (PSA) along a bottom side for good adherence to a mounting surface (e.g., a heat source, etc.).

FIG. 13 is a perspective view of an exemplary embodiment of a thermal interface material (TIM) including a memory foam core and graphite wrapped around the memory foam core. The TIM is disposed along (e.g., adhesively attached via PSA, etc.) a PCB-mounted component (broadly, a heat source) aligned for positioning within an opening or cavity defined by an enclosure or housing.

Figure 4:
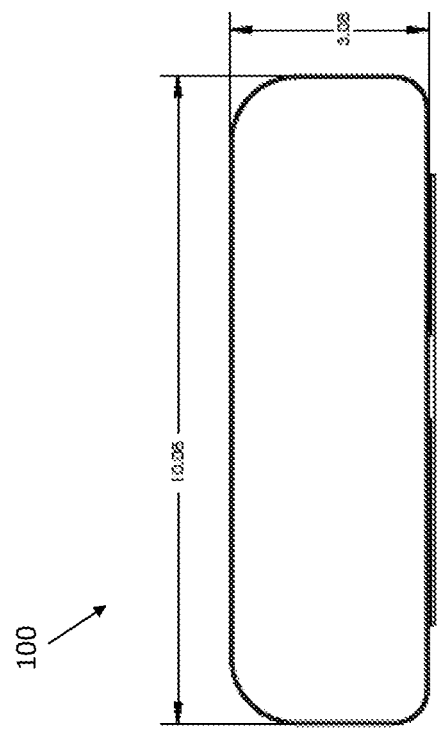
FIG. 4 is a front end view of the TIM shown in FIGS. 1 and 2, and showing an exemplary width of 10.08 mm and an exemplary uncompressed thickness or height of 3.08 mm according to an exemplary embodiment.

FIGS. 14 through 16 respectively illustrate the TIM and PCB-mounted component being positioned within the opening or cavity defined by an enclosure or housing shown in FIG. 13.

FIG. 17 illustrates the TIM shown in FIG. 14 in an uncompressed state before the TIM and PCB-mounted component are positioned within the opening or cavity defined by the enclosure or housing. FIG. 17 also shows the TIM having an exemplary uncompressed thickness or height of 5 mm according to an exemplary embodiment.

FIG. 18 illustrates the TIM shown in FIG. 15 in a compressed state in which the TIM and PCB-mounted component are slidably positionable within the opening or cavity defined by an enclosure or housing. FIG. 18 shows that the TIM has been compressed to an exemplary thickness or height of 1.8 mm from its initial uncompressed thickness or height of 5 mm shown in FIG. 17 according to an exemplary embodiment.

FIG. 19 illustrates the TIM shown in FIG. 16 after the TIM has been slidably positionable within the opening or cavity defined by an enclosure or housing and rebounded from the compressed state (e.g., after remaining compressed for at least about 2 minutes to allow for insertion into the enclosure, etc.). FIG. 19 shows that the TIM has rebounded from the compressed thickness or height of 1.8 mm shown in FIG. 18 to an exemplary thickness or height of 4.5 mm according to an exemplary embodiment.

Corresponding reference numerals may indicate corresponding (though not necessarily identical) parts throughout the several views of the drawings.

DETAILED DESCRIPTION

Example embodiments will now be described more fully with reference to the accompanying drawings.

Disclosed herein are exemplary embodiments of thermal interface materials including memory foam cores. Graphite may be disposed at least partially around the memory foam core in exemplary embodiments. For example, one or more flexible sheets of synthetic graphite and/or natural graphite may be wrapped around (e.g., entirely, only partially around, etc.) an outer perimeter defined by the sides of the memory foam core.

Also disclosed are exemplary methods of using TIMs including memory foam cores to provide thermal management solutions between heat sources (e.g., a heat generating component along a printed circuit board (PCB), etc.) and heat removal/dissipation structures or components (e.g., a heat sink, heat spreader, housing, enclosure, etc.).

In exemplary embodiments, a TIM including a memory foam core may be disposed along or installed to (e.g., adhesively attached via a PSA along, etc.) a mounting surface (e.g., a heat source, etc.), e.g., while the TIM and its memory foam core are uncompressed. The memory foam core of the TIM may then be compressed (e.g., from an initial uncompressed height or thickness of about 3 mm to a compressed height or thickness of no more than about 1 mm, etc.). The memory foam is preferably compressible with relatively low compression forces that are sufficiently low enough to avoid biasing and/or damaging the PCB and/or heat source.

Due to the memory foam characteristics, the memory foam core will very slowly rebound, recover, expand, or return towards its initial uncompressed state, height, or thickness. The memory foam core may preferably retain an at least partially compressed shape and reduced thickness for a predetermined minimum amount of time (e.g., less than 20% rebound at at least 2 minutes, etc.) that is sufficiently long enough to allow the heat source and the at least partially compressed TIM to be positioned within (e.g., slidably inserted into, etc.) an opening or cavity defined by a housing, enclosure, etc.

The heat source and the TIM with its at least partially compressed memory foam core may be slidably inserted within (e.g., slid under a downwardly protruding portion or lip of, etc.) a housing, enclosure, etc. such that the TIM is positioned within the housing, enclosure, etc. and aligned for eventually making thermal contact with a portion of the housing, enclosure, etc. Due to the at least partially compressed state of the memory foam, the TIM may be slid into the housing, enclosure, etc. without making sliding contact with the housing, enclosure, etc., which sliding contact might otherwise damage the TIM.

The memory foam core will slowly rebound and expand to fill the gap between the top graphite portion of the TIM and the housing, enclosure, etc. For example, the memory foam core may slowly rebound and expand to a predetermined minimum percentage (e.g., at least about 90 percent, about 100 percent, more than about 80 percent, etc.) of its initial uncompressed height or thickness to account for tolerances.

The memory foam expansion will reposition and force the graphite (or other thermally-conductive and/or heat spreading material) wrapped around the memory foam core to thermally contact the housing, enclosure, etc. With the graphite in thermal contact with the heat source and the housing, enclosure, etc., the graphite may then define at least a portion of a thermally-conductive heat path from the heat source, generally around the memory foam core, to the housing, enclosure, etc. The memory foam may thus operate as a switch that switches on the thermal interface material when the memory foam rebound or expansion forces the graphite into contact with the housing, enclosure, etc. thereby completing (switching on) the thermally-conductive pathway defined by the graphite from the heat source generally around the memory core to the housing, enclosure, etc.

Accordingly, exemplary embodiments disclosed herein include graphite over memory foam that is compressed and then the graphite over the compressed memory foam is assembled (e.g., slidably inserted, etc.) into a gap (e.g., a gap of about 2 mm, etc.) defined generally between two surfaces, such as between a top surface of a heat source and a surface of a heat removal/dissipation structure (e.g., a heat sink, heat spreader, housing, enclosure, etc.). An adhesive (e.g., pressure sensitive adhesive (PSA), etc.) may be disposed along the bottom of the graphite to adhere the graphite over memory foam to a mounting surface, e.g., a heat source along a PCB, etc. Preferably the top side of the graphite is not tacky, sticky, or adherent to avoid catching on a surface of a heat removal/dissipation structure (e.g., a heat sink, heat spreader, housing, enclosure, etc.) during installation.

In exemplary embodiments in which graphite is wrapped at least partially or entirely around a memory foam core, the TIM may also be referred to herein as graphite over memory foam gasket.

In exemplary embodiments, the TIM may have a rectangular cross-sectional shape or profile, a non-rectangular cross-sectional shape or profile, a combination thereof, etc. For example, exemplary embodiments may include TIMs having first and second opposite portions having different cross-sectional shapes or profiles. In an exemplary embodiment, a TIM has a first portion with a generally rectangular cross-section or profile and a second opposite portion with a generally triangular cross-section or profile. The downwardly slanted top surface of the second generally triangular portion may provide the TIM with a thinning or tapering leading edge and/or shear profile along the TIM's leading edge that may allow for less initial compression during assembly.

With reference now to the figures, FIGS. 1 and 2 illustrate a thermal interface material (TIM) 100 (broadly, an assembly, device, or gasket) including a memory foam core 104 according to an exemplary embodiment embodying one or more aspects of the present disclosure. As shown, graphite 108 is wrapped around the memory foam core 104. Pressure sensitive adhesive (PSA) 112 is along a bottom side for good adherence to a mounting surface (e.g., a heat source, etc.).

The graphite 108 may comprise a flexible sheet of natural and/or synthetic graphite. For example, the graphite 108 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet. Table 1 below includes additional details about Tgon™ 9000 series synthetic graphite from Laird Technologies.

In addition, FIGS. 1 and 2 show the graphite 108 wrapped entirely around an outer perimeter defined by the sides of the memory foam core 104. In alternative embodiments, the graphite 108 may be disposed or wrapped around less than the entire outer perimeter of the memory foam core 104. For example, an alternative embodiment includes graphite 108 disposed along the entirety of the top and sidewalls of the memory foam core 104. But in this alternative embodiment, the graphite 108 does not extend entirely across the bottom of the memory foam core 104 such that the graphite 108 includes spaced apart end portions along the bottom of the memory foam core 104, e.g., the graphite's spaced apart end portions may be adjacent and/or underneath the PSA 112 between the PSA 112 and memory foam core 104, etc.

In the exemplary embodiment shown in FIGS. 1 and 2, the TIM 100 has a generally rectangular cross-sectional shape or profile with rounded corners when the memory foam core 104 is uncompressed. Alternative embodiments may include a TIM with a different cross-sectional shape or profile, e.g., non-rectangular, etc.

In this exemplary embodiment, the TIM 100 includes graphite 108 wrapped around the memory foam core 104. In alternative exemplary embodiments, other heat spreading and/or thermally-conductive materials may alternatively or additionally be disposed at least partially around the memory foam core 104. Examples of other heat spreading and/or thermally-conductive materials include thermally-conductive foils (e.g., aluminum foil, copper foil, other metal foils, etc.), thermally-conductive and/or heat spreading fabrics or films, such as metallized and/or plated fabrics (e.g., nickel-copper plated nylon, etc.), metal-plated or metallized polyimide fabrics, poly-foil (e.g., metal foil laminated to polyester or PET, (PP), polyethylene (PE), other polymer, etc.), Mylar® polyester films, etc.

Figure 3:
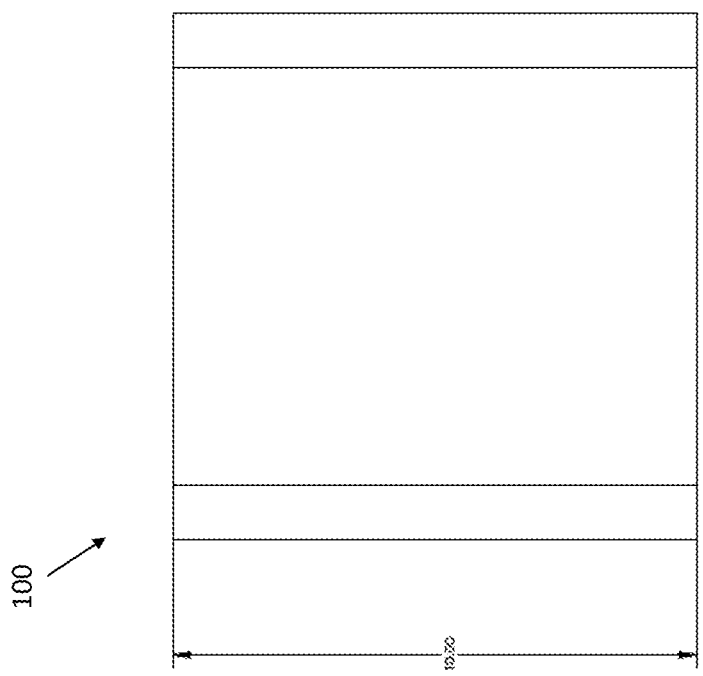
FIG. 3 is a top view of the TIM shown in FIGS. 1 and 2, and showing an exemplary length dimension of 10 millimeters (mm) according to an exemplary embodiment.

FIGS. 3 and 4 provide exemplary dimensions that may be used for the TIM 100 according to an exemplary embodiment. For example, the TIM 100 may have a length of 10 millimeters (mm) as shown in FIG. 3, and a width of 10.08 mm and an uncompressed thickness or height of 3.08 mm as shown in FIG. 4. Also by way of example, the graphite may have a thickness of about 25 micrometers (um). These dimensions are provided for purpose of example only as other exemplary embodiments may include a TIM having one or more different dimensions, e.g., a length greater or less than 10 mm, a width greater or less than 10.08 mm, an uncompressed thickness or height greater or less than 3.08 mm, and/or a graphite thickness greater or less than 25 um.

The TIM 100 may be used to provide a thermal management solution generally between a heat source (e.g., a heat generating component on a PCB, etc.) and an enclosure (broadly, a heat removal/dissipation structure or component). For example, the TIM 100 may be adhesively attached via the PSA 112 to a heat source, e.g., while the TIM 100 and its memory foam core 104 are uncompressed. The memory foam core 104 may then be compressed (e.g., from an initial uncompressed height or thickness of about 3 mm to a compressed height or thickness of no more than about 1 mm, etc.). The memory foam core 104 is preferably compressible with relatively low compression forces that are sufficiently low enough to avoid biasing and/or damaging the PCB and/or heat source.

Due to the memory foam characteristics, the memory foam core 104 will very slowly rebound, expand, or return towards its initial uncompressed height or thickness. The memory foam core 104 may preferably retain an at least partially compressed shape and reduced thickness for a predetermined minimum amount of time that is sufficiently long enough to allow the heat source and the at least partially compressed TIM 100 to be inserted into an enclosure. For example, the memory foam core 104 may have less than a 20% rebound at about 2 minutes or longer.

The heat source and the TIM 100 with its at least partially compressed memory foam core 104 may be slidably inserted within the enclosure such that the TIM 100 is aligned for making thermal contact with a portion of the enclosure. Due to the at least partially compressed state of the memory foam core 104, the TIM 100 may be slid into the enclosure without making sliding contact with the enclosure, which sliding contact might otherwise damage the TIM 100.

The memory foam core 104 will slowly rebound and expand to fill the gap between the top surface of the graphite 108 and the enclosure. For example, the memory foam core 104 may slowly rebound and expand to a predetermined minimum percentage (e.g., at least about 90 percent, about 100 percent, more than about 80 percent, etc.) of its initial uncompressed height or thickness to account for tolerances.

The memory foam expansion will reposition and force the graphite 108 to thermally contact the enclosure. With the graphite 108 in thermal contact with the heat source and the enclosure, the graphite 108 may then define at least a portion of a thermally-conductive heat path from the heat source generally around the memory foam core 104 to the enclosure.

Figure 6:
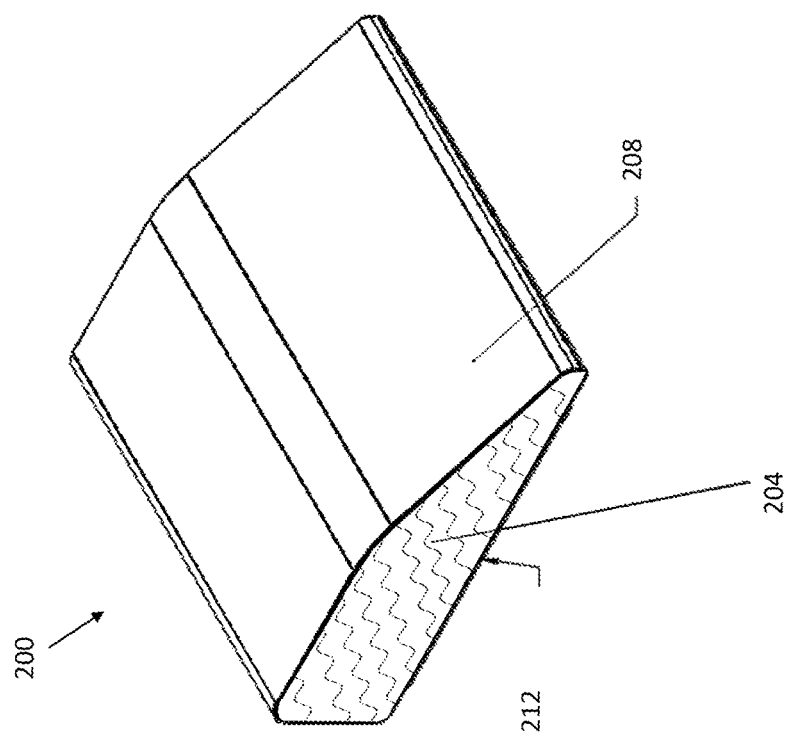
FIGS. 5 and 6 are perspective views of an exemplary embodiment of a thermal interface material (TIM) including a memory foam core, graphite wrapped around the memory foam core, and pressure sensitive adhesive (PSA) along a bottom side for good adherence to a mounting surface (e.g., a heat source, etc.).
Figure 5:
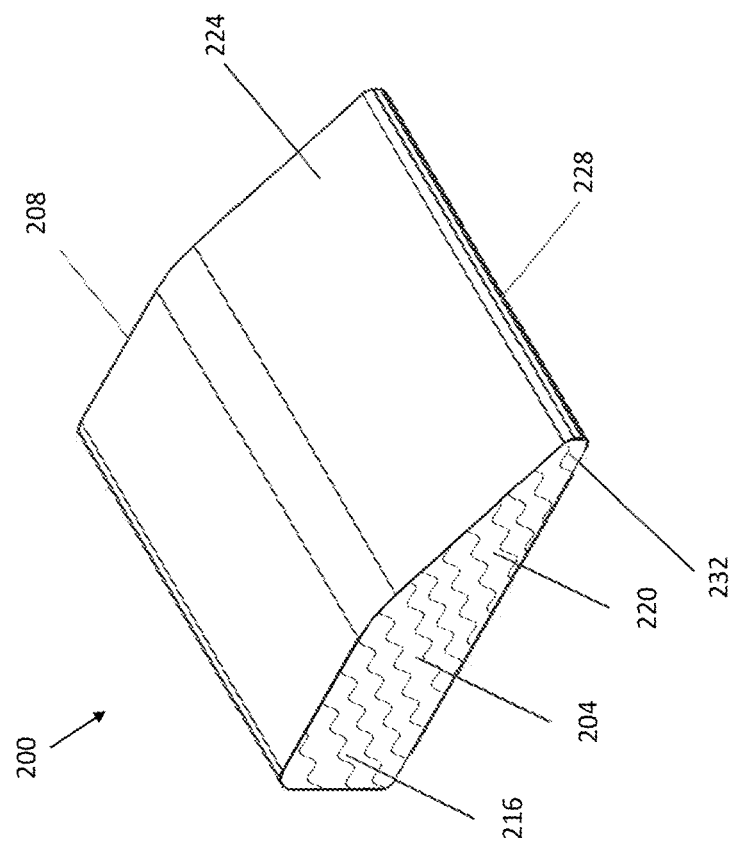

FIGS. 5 and 6 illustrate a thermal interface material (TIM) 200 including a memory foam core 204 according to an exemplary embodiment embodying one or more aspects of the present disclosure. As shown, graphite 208 is wrapped around the memory foam core 204. Pressure sensitive adhesive (PSA) 212 is along a bottom side for good adherence to a mounting surface (e.g., a heat source, etc.).

The graphite 208 may comprise a flexible sheet of natural and/or synthetic graphite. For example, the graphite 208 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet. Table 1 below includes additional details about Tgon™ 9000 series synthetic graphite from Laird Technologies.

In addition, FIGS. 5 and 6 show the graphite 208 wrapped entirely around an outer perimeter defined by the sides of the of the memory foam core 204. In alternative embodiments, the graphite 208 may be disposed or wrapped around less than the entire outer perimeter of the memory foam core 204. For example, an alternative embodiment includes graphite 208 disposed along the entirety of the top and sidewalls of the memory foam core 204. But in this alternative embodiment, the graphite 208 does not extend entirely across the bottom of the memory foam core 204 such that the graphite 208 includes spaced apart end portions along the bottom of the memory foam core 204, e.g., the graphite's spaced apart end portions may be adjacent and/or underneath the PSA 212 between the PSA 212 and memory foam core 204, etc.

In the exemplary embodiment shown in FIGS. 5 and 6, the TIM 200 has opposite first and second portions 216, 220 (or left and right portions in FIG. 5) with different cross-sectional shapes or profiles. As shown in FIG. 5, the first portion 216 has a generally rectangular cross-sectional shape or profile, and the second portion 220 has a generally triangular cross-sectional shape or profile. The downwardly slanted top surface 224 of the generally triangular shaped profile may provide the TIM 200 with a thinning or tapering leading edge 228 and/or shear profile along the TIM's leading edge 228 that allows for less initial compression during assembly. As shown in FIG. 5, a portion 232 of the memory foam core 204 may be disposed or intervene between the upper and lower graphite portions along the TIM's leading edge 228, which inhibits or prevents direct abutting contact between the upper and lower graphite portions along the TIM's leading edge 228. Alternative embodiments may include a TIM with a different cross-sectional shape or profile.

In this exemplary embodiment, the TIM 200 includes graphite 208 wrapped around the memory foam core 204. In alternative exemplary embodiments, other heat spreading and/or thermally-conductive materials may alternatively or additionally be disposed at least partially around the memory foam core 204. Examples of other heat spreading and/or thermally-conductive materials include thermally-conductive foils (e.g., aluminum foil, copper foil, other metal foils, etc.), thermally-conductive and/or heat spreading fabrics or films, such as metallized and/or plated fabrics (e.g., nickel-copper plated nylon, etc.), metal-plated or metallized polyimide fabrics, poly-foil (e.g., metal foil laminated to polyester or PET, polypropylene (PP), polyethylene (PE), other polymer, etc.), Mylar® polyester films, etc.

Figure 8:
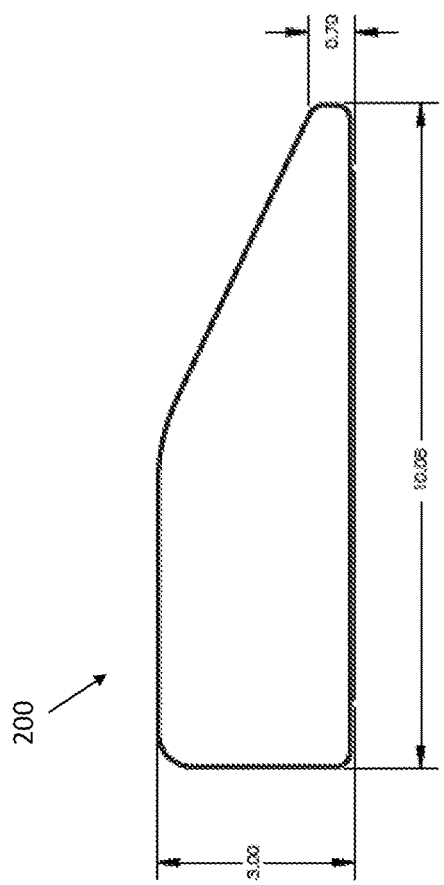
FIG. 8 is a front end view of the TIM shown in FIGS. 5 and 6, and showing an exemplary width of 10.08 mm and exemplary uncompressed thicknesses or heights of 3 mm for the rectangular portion and 0.7 mm for the triangular portion according to an exemplary embodiment.
Figure 7:
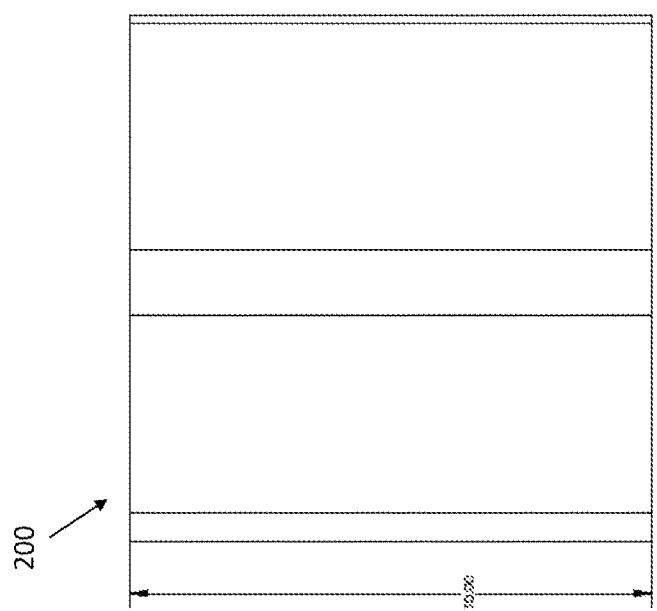
FIG. 7 is a top view of the TIM shown in FIGS. 5 and 6, and showing an exemplary length dimension of 10 millimeters (mm) according to an exemplary embodiment.

FIGS. 7 and 8 provide exemplary dimensions that may be used for the TIM 200 according to an exemplary embodiment. For example, the TIM 200 may have a length of 10 millimeters (mm) as shown in FIG. 7, and a width of 10.08 mm, and uncompressed thicknesses or heights of 3 mm for the rectangular portion and 0.7 mm for the triangular portion as shown in FIG. 8. Also by way of example, the graphite may have a thickness of about 25 micrometers (um). These dimensions are provided for purpose of example only as other exemplary embodiments may include a TIM having one or more different dimensions, e.g., a length greater or less than 10 mm, a width greater or less than 10.08 mm, an uncompressed thickness or height greater or less than 3 mm for the rectangular portion, an uncompressed thickness or height greater or less than 0.7 mm for the triangular portion, and/or a graphite thickness greater or less than 25 um.

The TIM 200 may be used to provide a thermal management solution generally between a heat source (e.g., a heat generating component on a PCB, etc.) and an enclosure (broadly, a heat removal/dissipation structure or component). For example, the TIM 200 may be adhesively attached via the PSA 212 to a heat source, e.g., while the TIM 200 and its memory foam core 204 are uncompressed. The memory foam core 204 may then be compressed (e.g., from an initial uncompressed height or thickness of about 3 mm to a compressed height or thickness of no more than about 1 mm, etc.). The memory foam core 204 is preferably compressible with relatively low compression forces that are sufficiently low enough to avoid biasing and/or damaging the PCB and/or heat source.

Due to the memory foam characteristics, the memory foam core 204 will very slowly rebound, expand, or return towards its initial uncompressed height or thickness. The memory foam core 204 may preferably retain an at least partially compressed shape and reduced thickness for a predetermined minimum amount of time that is sufficiently long enough to allow the heat source and the at least partially compressed TIM 200 to be inserted into an enclosure. For example, the memory foam core 204 may have less than a 20% rebound at about 2 minutes or longer.

The heat source and the TIM 200 with its at least partially compressed memory foam core 204 may be slidably inserted within the enclosure such that the TIM 200 is aligned to make thermal contact with a portion of the enclosure. Due to the at least partially compressed state of the memory foam core 204, the TIM 200 may be slid into the enclosure without making sliding contact with the enclosure, which sliding contact might otherwise damage the TIM 200.

The memory foam core 204 will slowly rebound and expand to fill the gap between the top surface of the graphite 208 and the enclosure. For example, the memory foam core 204 may slowly rebound and expand to a predetermined minimum percentage (e.g., at least about 90 percent, about 100 percent, more than about 80 percent, etc.) of its initial uncompressed height or thickness to account for tolerances.

The memory foam expansion will reposition and force the graphite 208 to thermally contact the enclosure. With the graphite 208 in thermal contact with the heat source and the enclosure, the graphite 208 may then define at least a portion of a thermally-conductive heat path from the heat source generally around the memory foam core 204 to the enclosure.

Figure 10:
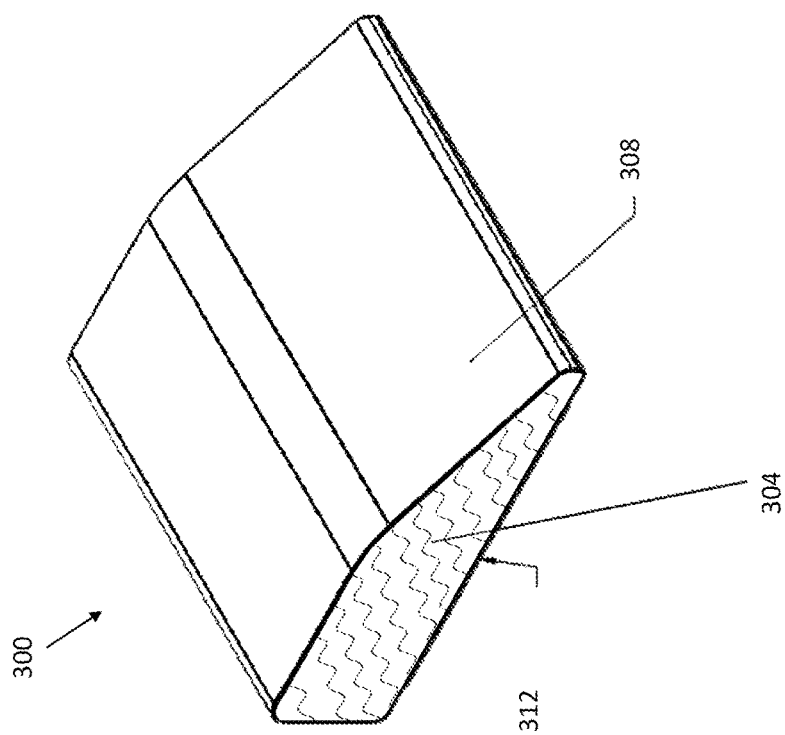
FIGS. 9 and 10 are perspective views of an exemplary embodiment of a thermal interface material (TIM) including a resilient (e.g., foam, etc.) core, graphite wrapped around the resilient core, and pressure sensitive adhesive (PSA) along a bottom side for good adherence to a mounting surface (e.g., a heat source, etc.).
Figure 9:
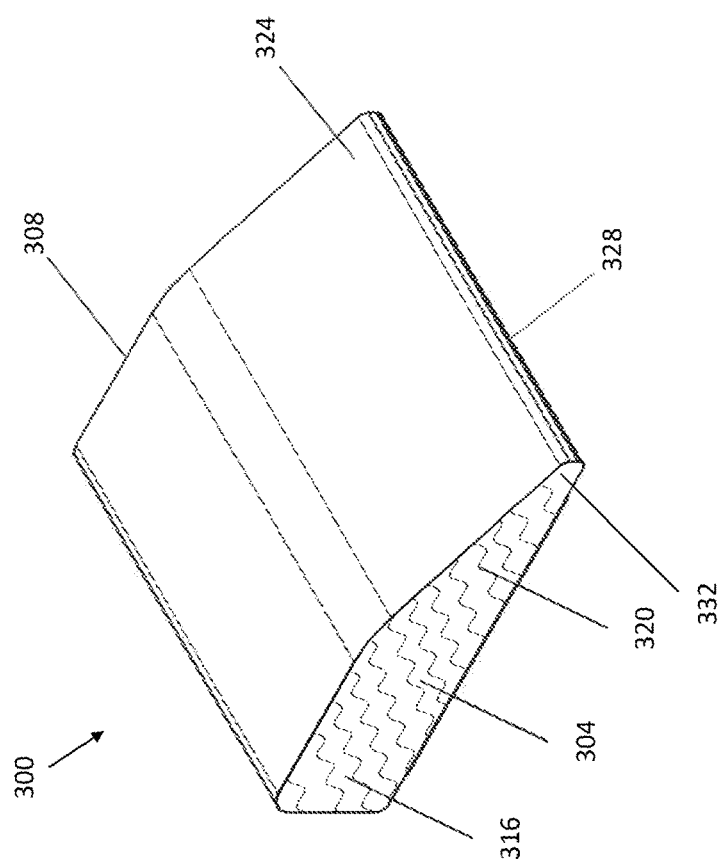

FIGS. 9 and 10 illustrate a thermal interface material (TIM) 300 including a resilient core 304 (e.g., polyurethane foam, memory foam, etc.) according to an exemplary embodiment embodying one or more aspects of the present disclosure. As shown, graphite 308 is wrapped around the resilient core 304. Pressure sensitive adhesive (PSA) 312 is along a bottom side for good adherence to a mounting surface (e.g., a heat source, etc.).

The graphite 308 may comprise a flexible sheet of natural and/or synthetic graphite. For example, the graphite 308 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet. Table 1 below includes additional details about Tgon™ 9000 series synthetic graphite from Laird Technologies.

In addition, FIGS. 9 and 10 show the graphite 308 wrapped entirely around an outer perimeter defined by the sides of the resilient core 304. In alternative embodiments, the graphite 308 may be disposed or wrapped around less than the entire outer perimeter of the resilient core 304. For example, an alternative embodiment includes graphite 308 disposed along the entirety of the top and sidewalls of the resilient core 304. But in this alternative embodiment, the graphite 308 does not extend entirely across the bottom of the resilient core 304 such that the graphite 308 includes spaced apart end portions along the bottom of the resilient core 304, e.g., the graphite's spaced apart end portions may be adjacent and/or underneath the PSA 312 between the PSA 312 and resilient core 304, etc.

In this exemplary embodiment, the TIM 300 has opposite first and second portions 316, 320 (or left and right portions in FIG. 9) with different cross-sectional shapes or profiles. As shown in FIG. 9, the first portion 316 has a generally rectangular cross-sectional shape or profile, and the second portion 320 has a generally triangular cross-sectional shape or profile. The downwardly slanted top surface 324 of the generally triangular shaped profile may provide the TIM 300 with a thinning or tapering leading edge 328 and/or shear profile along the TIM's leading edge 328 that allows for less initial compression during assembly. As shown in FIG. 9, a portion 332 of the resilient core 304 may be disposed or intervene between the upper and lower graphite portions along the TIM's leading edge 328, which inhibits or prevents direct abutting contact between the upper and lower graphite portions along the TIM's leading edge 328. Alternative embodiments may include a TIM with a different cross-sectional shape or profile.

In this exemplary embodiment, the TIM 300 includes graphite 308 wrapped around the resilient core 304. In alternative exemplary embodiments, other heat spreading and/or thermally-conductive materials may alternatively or additionally be disposed at least partially around the resilient core 304. Examples of other heat spreading and/or thermally-conductive materials include thermally-conductive foils (e.g., aluminum foil, copper foil, other metal foils, etc.), thermally-conductive and/or heat spreading fabrics or films, such as metallized and/or plated fabrics (e.g., nickel-copper plated nylon, etc.), metal-plated or metallized polyimide fabrics, poly-foil (e.g., metal foil laminated to polyester or PET, polypropylene (PP), polyethylene (PE), other polymer, etc.), Mylar® polyester films, etc.

The resilient core 304 may include any suitable resilient material. For example, the resilient core 304 may be formed of a foam material, such as polyurethane foam, memory foam, silicone foam material, polymeric elastomer material, cellular polymeric foam, open cell foam, closed cell foam, neoprene foam, urethane foam, polyester foam, polyether foam, silicone rubber material, combinations thereof, etc. In some example embodiments, the resilient core 304 may be extruded. The resilient core 304 may be electrically conductive and/or thermally conductive. For example, the resilient core 304 may include thermally and/or electrically conductive fillers dispersed therein.

Figure 12:
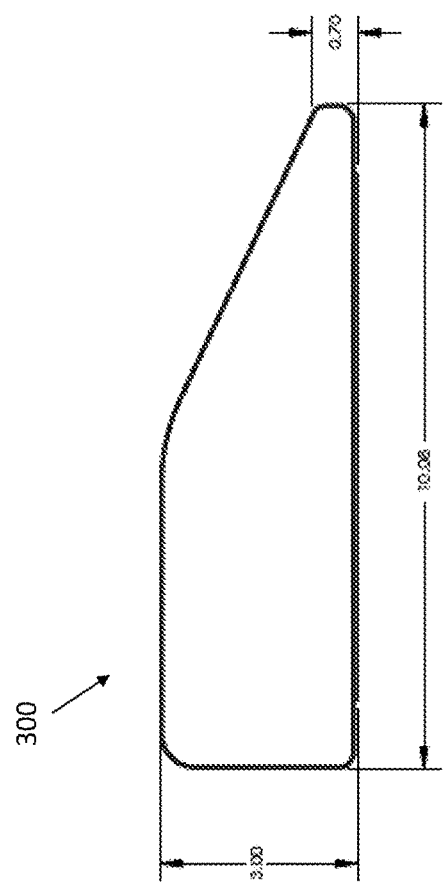
FIG. 12 is a front end view of the TIM shown in FIGS. 9 and 10, and showing an exemplary width of 10.08 mm and exemplary uncompressed thicknesses or heights of 3 mm for the rectangular portion and 0.7 mm for the triangular portion according to an exemplary embodiment.
Figure 11:
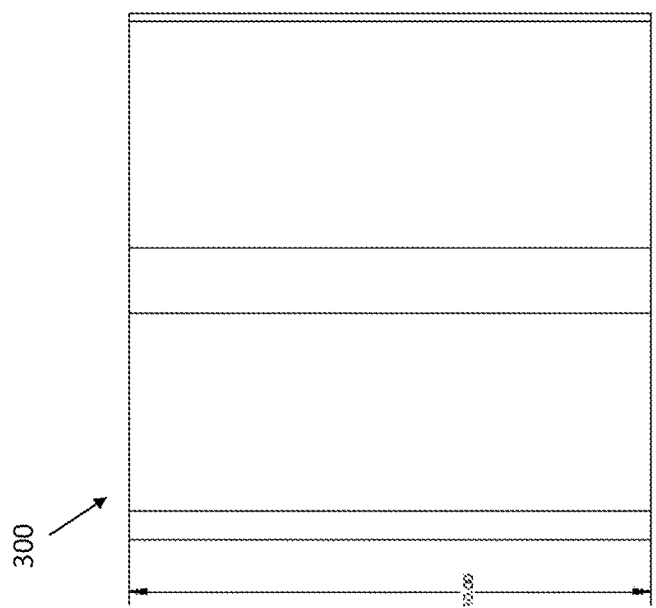
FIG. 11 is a top view of the TIM shown in FIGS. 9 and 10, and showing an exemplary length dimension of 10 millimeters (mm) according to an exemplary embodiment.

FIGS. 11 and 12 provide exemplary dimensions that may be used for the TIM 300 according to an exemplary embodiment. For example, the TIM 300 may have a length of 10 millimeters (mm) as shown in FIG. 11, and a width of 10.08 mm, and uncompressed thicknesses or heights of 3 mm for the rectangular portion and 0.7 mm for the triangular portion as shown in FIG. 12. Also by way of example, the graphite may have a thickness of about 25 micrometers (um). These dimensions are provided for purpose of example only as other exemplary embodiments may include a TIM having one or more different dimensions, e.g., a length greater or less than 10 mm, a width greater or less than 10.08 mm, an uncompressed thickness or height greater or less than 3 mm for the rectangular portion, an uncompressed thickness or height greater or less than 0.7 mm for the triangular portion, and/or a graphite thickness greater or less than 25 um.

The TIM 300 may be used to provide a thermal management solution generally between a heat source (e.g., a heat generating component on a PCB, etc.) and an enclosure (broadly, a heat removal/dissipation structure or component). For example, the TIM 300 may be adhesively attached via the PSA 312 to a heat source and positioned within an enclosure such that the graphite 308 is in thermal contact with the heat source and the enclosure. The graphite 308 may then define at least a portion of a thermally-conductive heat path from the heat source generally around the resilient core 304 to the enclosure.

FIGS. 13 and 17-19 illustrate a thermal interface material (TIM) 400 including a memory foam core 404 and graphite 408 wrapped around the memory foam core 404 according to an exemplary embodiment embodying one or more aspects of the present disclosure. Pressure sensitive adhesive (PSA) 412 is along a bottom side for good adherence to a mounting surface (e.g., a heat source, etc.).

As shown in FIG. 13, the TIM 400 is disposed along (e.g., adhesively attached via PSA 412, etc.) a component 440 (broadly, a heat source), which, in turn, is disposed or mounted along a printed circuit board (PCB) 444 (broadly, a substrate). The TIM 400, component 440, and PCB 444 are aligned for positioning within an opening or cavity defined by an enclosure or housing 448.

The TIM 400 may be used to provide a thermal management solution generally between a heat source (e.g., the heat generating component 440 on the PCB 444, etc.) and an enclosure 448 (broadly, a heat removal/dissipation structure or component). For example, the TIM 400 may be adhesively attached via the PSA 412 to a heat source, e.g., while the TIM 400 and its memory foam core 404 are uncompressed as shown in FIGS. 14 and 17. The memory foam core 404 may then be compressed as shown in FIGS. 15 and 18, e.g., from an initial uncompressed height or thickness of about 5 mm (FIG. 17) to a compressed height or thickness of about 1.8 mm, etc. The memory foam core 404 is preferably compressible with relatively low compression forces that are sufficiently low enough to avoid biasing and/or damaging the PCB 444 and/or heat source 440.

The TIM 400 with its at least partially compressed memory foam core 404, the component 444, and PCB 448 may be slidably inserted within the enclosure 448 such that the TIM 400 is aligned for making thermal contact with a portion of the enclosure 448 as shown by FIGS. 15 and 16. Due to the at least partially compressed state of the memory foam core 404, the TIM 400 may be slid into the enclosure 448 without making sliding contact with the enclosure 448, which sliding contact might otherwise damage the TIM 400.

The memory foam core 404 will slowly rebound and expand to fill the gap between the top surface of the graphite 408 and the enclosure 448. For example, the memory foam core 404 may remain compressed for at least about two minutes for assembly and insertion into the enclosure 448. Thereafter, the memory foam core 404 may rebound from a compressed thickness or height of about 1.8 mm (FIG. 18) to a thickness or height of about 4.5 mm (FIG. 19). The dimensions provided in FIGS. 17-19 are provided for purpose of example only as other exemplary embodiments may include a TIM having one or more different dimensions.

The memory foam expansion will reposition and force the graphite 408 to thermally contact the enclosure 448. With the graphite 408 in thermal contact with the heat source 440 and the enclosure 448, the graphite 408 may define at least a portion of a thermally-conductive heat path from the heat source 440 generally around the memory foam core 404 to the enclosure 408. Accordingly, the memory foam may thus operate as a switch that switches on the thermal interface material 400 when the memory foam rebound or expansion forces the graphite 408 into contact with the enclosure 448, thereby completing (switching on) the thermally-conductive pathway defined by the graphite 408 from the heat source 440 generally around the memory core 404 to the enclosure 448.

The graphite 408 may comprise a flexible sheet of natural and/or synthetic graphite. For example, the graphite 408 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet. Table 1 below includes additional details about Tgon™ 9000 series synthetic graphite from Laird Technologies.

In addition, FIGS. 17-19 show the graphite 408 wrapped entirely around an outer perimeter defined by the sides of the memory foam core 404. In alternative embodiments, the graphite 408 may be disposed or wrapped around less than the entire outer perimeter of the memory foam core 404. For example, an alternative embodiment includes graphite 408 disposed along the entirety of the top and sidewalls of the memory foam core 404. But in this alternative embodiment, the graphite 408 does not extend entirely across the bottom of the memory foam core 404 such that the graphite 408 includes spaced apart end portions along the bottom of the memory foam core 404, e.g., the graphite's spaced apart end portions may be adjacent and/or underneath the PSA 412 between the PSA 412 and memory foam core 404, etc.

In the exemplary embodiment shown in FIGS. 17-19, the TIM 400 has a generally rectangular cross-sectional shape or profile with rounded corners when the memory foam core 404 is uncompressed. Alternative embodiments may include a TIM with a different cross-sectional shape or profile, e.g., non-rectangular, etc.

In this exemplary embodiment, the TIM 400 includes graphite 408 wrapped around the memory foam core 404. In alternative exemplary embodiments, other heat spreading and/or thermally-conductive materials may alternatively or additionally be disposed at least partially around the memory foam core 104. Examples of other heat spreading and/or thermally-conductive materials include thermally-conductive foils (e.g., aluminum foil, copper foil, other metal foils, etc.), thermally-conductive and/or heat spreading fabrics or films, such as metallized and/or plated fabrics (e.g., nickel-copper plated nylon, etc.), metal-plated or metallized polyimide fabrics, poly-foil (e.g., metal foil laminated to polyester or PET, (PP), polyethylene (PE), other polymer, etc.), Mylar® polyester films, etc.

In some embodiments, the graphite wrapped around the memory foam may comprise a sheet of synthetic graphite. The graphite sheet may include a polyethylene terephthalate (PET) layer for increased mechanical and/or abrasion resistance and/or an adhesive material (e.g., pressure sensitive adhesive (PSA), etc.) for adhering the graphite sheet to a surface(s), for connecting the graphite sheet to a surface(s), etc. In exemplary embodiments, the graphite may comprise one or more graphite sheets from Laird Technologies, such as one or more Tgon™ 800 series natural graphite sheets (e.g., Tgon™ 805, 810, 820, etc.), Tgon™ 8000 series graphite sheets, Tgon™ 9000 series synthetic graphite sheets (e.g., Tgon™ 9017, 9025, 9040, 9070, 9100, etc.), other graphite sheet materials, etc. Table 1 below includes additional details about Tgon™ 9000 series synthetic graphite from Laird Technologies.

The graphite sheet(s) may include one or more Tgon™ 9000 series graphite sheets that comprise synthetic graphite thermal interface materials having a carbon in-plane monocrystal structure and that are ultra-thin, light-weight, flexible and offer excellent in-plane thermal conductivity. Tgon™ 9000 series graphite sheets are useful for a variety of heat spreading applications where in-plane thermal conductivity dominates and in limited spaces. Tgon™ 9000 series graphite sheets may have a thermal conductivity from about 500 W/mK to about 1900 W/mK, may help reduce hot spots and protect sensitive areas, may enable slim device designs due to the ultra-thin sheet thickness of about 17 micrometers to about 100 micrometers, may be light weight (e.g., density from about 2.05 to 2.25 g/cm$^3$ for a thickness of 17 micrometers or 25 micrometers, etc.), may be flexible and able to withstand more than 10,000 times bending with radius of 5 millimeters.

TABLE 1

| Product Name | | Test Method | Tgon 9017 | Tgon 9025 | Tgon 9040 | Tgon 9070 | Tgon 9100 |
|---|---|---|---|---|---|---|---|
| Thickness (mm) | | ASTM D374 | 0.017 +/− 0.005 | 0.025 +/− 0.005 | 0.04 +/− 0.005 | 0.07 +/− 0.001 | 0.1 +/− 0.01 |
| Thermal conductivity (W/mK) | X, Y direction | ASTM E1461 | 1650~1900 | 1500~1700 | 1150~1400 | 700~1000 | 500~700 |
|  | Z direction |  | 15 | 15 | 15 | 15 | 15 |
| Thermal diffusivity (cm$^2$/s) | | ASTM E1461 | 9 | 9 | 8 | 7 | 7 |
| Density (g/cm$^3$) | | ASTM D792 | 2.05~2.25 | 2.05~2.25 | 1.65~1.85 | 1.0~1.3 | 0.7~1.0 |
| Specific heat (50° C.)(J/gK) | | ASTM E1269 | 0.85 | 0.85 | 0.85 | 0.85 | 0.85 |
| Heat resistance (° C.) | | Over 100 hours of testing | 400 | 400 | 400 | 400 | 400 |
| Extensional strength (MPa) | X, Y direction | ASTM F152 | 39 | 28 | 23 | 20 | 19.2 |
|  | Z direction |  | 0.1 | 0.4 | 0.4 | 0.4 | 0.65 |
| Bending test(times) (RS/180°) | | ASTM D2176 | 10,000 or more | 10,000 or more | 10,000 or more | 10,000 or more | 10,000 or more |
| Electric conductivity (S/cm) | | ASTM E1269 | 20000 | 20000 | 20000 | 96000 | 96000 |

It may be desirable for the TIM to exhibit good thermal conductivity and electrical conductivity characteristics in some exemplary embodiments. In such exemplary embodiments, an electrically conductive film (broadly, an electrically conductive layer or material) may be disposed along portions (or all) of a memory foam core. A heat spreader (e.g., graphite, etc.) may be disposed along portions (or all) of the electrically conductive film. In this example, the heat spreader may exhibit excellent in-plane thermal conductivity (e.g., in the X-Y direction). This allows heat to move through the heat spreader from one side of the TIM or gasket to another side of the TIM or gasket. The heat spreader may have a defined pattern formed of one contiguous layer or multiple noncontiguous layers to move the heat. The heat spreader layer(s) may define exposed regions of the electrically conductive film whereat the heat spreader is absent. The exposed regions may contact adjacent electrically conductive components in a device, and create an electrically conductive path that may be employed in various applications such as electrical grounding, shielding, etc. Continuing with this example, the electrically conductive film or layer may be disposed along some sides of the memory foam core and a heat spreader may cover at least a portion of the electrically conductive film such that the portion of the electrically conductive film is between the memory foam core and the heat spreader. The heat spreader may cover some portions, but not the entire, perimeter of the TIM.

Exemplary embodiments disclosed herein may be used with a wide range of devices, including electronic devices having one or more heat sources, heat removal/dissipation structures or components, shielding structures or components, and/or other suitable features. The heat removal/dissipation structures or components may include, e.g., a heat spreader, a heat sink, a heat pipe, a device exterior case, enclosure, or housing, etc. The shielding structures or components may include, e.g., board level EMI shielding structures or components, etc. Generally, a heat source may include any component or device that has a higher temperature than the TIM or otherwise provides or transfers heat to the TIM regardless of whether the heat is generated by the heat source or merely transferred through or via the heat source. For example, a heat source may include one or more heat generating components or devices (e.g., a CPU, die with underfill, semiconductor device, flip chip device, graphics processing unit (GPU), digital signal processor (DSP), multiprocessor system, integrated circuit, multi-core processor, etc.), a substrate (e.g., a circuit board such as a printed circuit board, etc.), etc. Accordingly, aspects of the present disclosure should not be limited to any particular use with any single type of heat source, electronic device, heat removal/dissipation structure, etc.

In examples where graphite is disposed at least partially around a memory foam core, the graphite may optionally include a layer/coating such as a polyethylene terephthalate (PET) or other plastic for increased mechanical strength and/or abrasion resistance. The layer/coating may be adhered (e.g., via a silicone pressure sensitive adhesive (PSA), etc.) to one or both sides of the graphite. In some examples, the layer/coating is only adhered to the outer facing sides of the graphite.

In some exemplary embodiments, the graphite may be enclosed or enveloped by a coating (e.g., a polyethylene terephthalate (PET), etc.), which may replace and/or allow for elimination of tape as the mechanism to enclose the graphite. For example, a coating may be disposed along the top and bottom major graphite surfaces such that the graphite is within an envelope style wrapping or coating. The coating may be operable to provide electrical insulation and conductivity where desired and/or seal the graphite so that loose graphite particles or flakes cannot escape.

By way of example, some exemplary embodiments may include graphite that is offset from edge(s) of a mounting surface (e.g., edge(s) of a resilient core, memory foam, polyurethane foam, double sided PSA between the graphite and stamped metal shield, other mounting surface, etc.), which may thereby allow the coating (e.g., PET coating, etc.) to cover the graphite. After the graphite is applied to the mounting surface, a PET coating (or other suitable coating) may be applied along the top surface (e.g., along the entire top surface, etc.) of the graphite and offset past the edge(s) of the graphite to the initial mounting surface to which the graphite was applied. Advantageously, this may allow for more graphite to be used as the coating may allow graphite closer to the edge(s) of the coating because of the higher adhesive ability of the coating and tighter assembly tolerances. The use of more graphite may allow for improved heat spreading. The coating may be applied very thin, thus allowing for thinner stacking heights.

By way of background, room temperature vulcanizing (RTV) silicone may be dispensed through a nozzle to provide a conventional thermal management solution between a heat generating component on a PCB and an enclosure. But drawbacks with this conventional method of providing a thermal management solution include the dispensing and messiness. By comparison, exemplary embodiments including memory foam as disclosed herein (e.g., 100 (FIGS. 1 and 3), 200 (FIGS. 5 and 6), etc.) may provide thermal management solutions that are less messy and/or have better thermal conductivity than the thermal management solutions provided by dispensing RTV silicone through a nozzle. Exemplary embodiments including memory foam as disclosed herein (e.g., 100 (FIGS. 1 and 3), 200 (FIGS. 5 and 6), etc.) may allow assembly into tight gaps by over compressing the memory foam and allowing the memory foam to rebound and/or may allow for more time to install or apply the TIM due to the slow rebound of the memory foam after compression.

Generally, memory foam consists mainly of polyurethane as well as additional chemicals increasing its viscosity and density. Memory foam may be referred to as viscoelastic polyurethane foam, or low-resilience polyurethane foam (LRPu). Memory foam includes foam bubbles or cells that are open, effectively creating a matrix through which air can move. Memory foam may be created by feeding gas into a polymer matrix. Memory foam has an open-cell solid structure that matches pressure against it yet slowly springs back to its original shape. In some exemplary embodiments, the memory foam may comprise gel-infused memory foam and/or one or more additives (e.g., thermally conductive particles to the memory foam, etc.).

In some exemplary embodiments, one or more additives or fillers may be added to the memory foam and/or other resilient material used for the resilient core. A wide variety of additives or fillers may be incorporated into the memory foam or other resilient core material (e.g., polyurethane foam, etc.) to tailor, modify, and/or functionally tune property(ies) of the memory foam core or other resilient core. For example, the fillers may include one or more latent heat storage materials such as wax or other phase change material. By way of further example, the fillers may include functional nanoparticles, electrically-conductive fillers, thermally-conductive fillers, EMI or microwave absorbing fillers, magnetic fillers, dielectric fillers, coated fillers, combinations thereof, etc. Example fillers include carbon black, boron nitride, nickel cobalt, carbonyl iron, iron silicide, iron particles, iron-chrome compounds, silver, an alloy containing 85% iron, 9.5% silicon and 5.5% aluminum, an alloy containing about 20% iron and 80% nickel, ferrites, magnetic alloys, magnetic powders, magnetic flakes, magnetic particles, nickel-based alloys and powders, chrome alloys, aluminum oxide, copper, zinc oxide, alumina, aluminum, graphite, ceramics, silicon carbide, manganese zinc, fiberglass, combinations thereof, etc. The fillers may comprise one or more of granules, spheroids, microspheres, ellipsoids, irregular spheroids, strands, flakes, powder, and/or a combination of any or all of these shapes. In addition, exemplary embodiments may also include different grades (e.g., different sizes, different purities, different shapes, etc.) of the same (or different) fillers.

In some exemplary embodiments, the TIM is electrically conductive and thermally conductive. For example, a TIM disclosed herein may have an electrical resistance of less than 1 ohm per inch length (e.g., in the Z-direction or the XY-direction), and a thermal resistance (under a 20% compression ratio) of less than 1.5° C.-in$^2$/W per millimeter height (e.g., in the Z-direction).

In an exemplary embodiment, a thermal interface material includes a memory foam core including a plurality of sides defining a perimeter. A heat spreader is disposed at least partially around the perimeter defined by the plurality of sides of the memory foam core.

In this exemplary embodiment, the memory foam core may comprise a viscoelastic polyurethane foam, a low-resilience polyurethane foam, a gel-infused memory foam. The heat spreader may comprise natural graphite and/or synthetic graphite.

The memory foam core may be configured to be compressible into a compressed shape having a reduced thickness and to thereafter retain the compressed shape having the reduced thickness for a predetermined minimum amount of time and/or with less than twenty percent rebound for at least two minutes.

The memory foam core is compressible such that a portion of the heat spreader is alignable with a corresponding portion of a heat removal/dissipation structure while the memory foam core remains compressed to thereby avoid sliding contact of the heat spreader with the heat removal/dissipation structure. Expansion of the compressed memory foam core will force the aligned portion of the heat spreader into thermal contact with the corresponding portion of the heat removal/dissipation structure whereby the heat spreader will define at least a portion of a thermally-conductive heat path at least partially around the perimeter defined by the plurality of sides of the memory foam core to the heat removal/dissipation structure.

The memory foam core may be configured to be compressible such that the thermal interface material is slidably positionable within an enclosure to align the heat spreader for thermal contact with an enclosure while the memory foam core remains compressed to thereby avoid sliding contact of the heat spreader with the enclosure. Within the enclosure, expansion of the compressed memory foam core will force the heat spreader into thermal contact with the enclosure, such that the heat spreader will define at least a portion of a thermally-conductive heat path at least partially around the perimeter defined by the plurality of sides of the memory foam core to the enclosure.

The heat spreader may comprise a graphite sheet wrapped entirely around the perimeter defined by the plurality of sides of the memory foam core.

The thermal interface material may comprise: a first portion with a generally rectangular cross-section or profile; and a second opposite portion with a generally triangular cross-section or profile including a downwardly slanted top surface that provides the thermal interface material with a tapering leading edge.

A portion of the memory foam core may be disposed between upper and lower portions of the heat spreader along a leading edge of the thermal interface material. The portion of the memory foam core inhibits direct abutting contact between the upper and lower portions of the heat spreader along the leading edge of the thermal interface material.

The heat spreader may comprises graphite, such that the thermal interface material is a graphite over memory foam gasket.

The heat spreader may comprise one or more of a graphite sheet, aluminum foil, and/or copper foil.

In an exemplary embodiment, a device includes a heat source, the thermal interface material disposed along the heat source, and an enclosure. The heat source and the thermal interface material are slidably positionable within the enclosure while the memory foam core is at least partially compressed to thereby avoid sliding contact of the heat spreader with the enclosure. Within the enclosure, expansion of the compressed memory foam core will force the heat spreader into thermal contact with the enclosure whereby the heat spreader will define at least a portion of a thermally-conductive heat path from the heat source at least partially around the perimeter defined by the plurality of sides of the memory foam core to the enclosure.

In an exemplary embodiment, a thermal interface material includes a resilient core including a plurality of sides defining a perimeter; and graphite disposed at least partially around the perimeter defined by the plurality of sides of the resilient core. A portion of the resilient core is disposed between upper and lower portions of the graphite along a leading edge of the thermal interface material. The portion of the resilient core inhibits direct abutting contact between the upper and lower portions of the graphite along the leading edge of the thermal interface material.

In this exemplary embodiment, the thermal interface material may comprise: a first portion with a generally rectangular cross-section or profile; and a second opposite portion with a generally triangular cross-section or profile including a downwardly slanted top surface that provides the thermal interface material with a tapering leading edge portion that reduces in height along a direction from the first portion to the leading edge. The resilient core may comprises a memory foam core. The graphite may comprise natural graphite and/or synthetic graphite. The memory foam core may be configured to be compressible into a compressed shape having a reduced thickness and to thereafter retain the compressed shape having the reduced thickness for a predetermined minimum amount of time.

The memory foam core may be compressible such that a portion of the graphite is alignable with a corresponding portion of a heat removal/dissipation structure while the memory foam core remains compressed to thereby avoid sliding contact of the graphite with the heat removal/dissipation structure. Expansion of the compressed memory foam core will force the aligned portion of the graphite into thermal contact with the corresponding portion of the heat removal/dissipation structure whereafter the graphite will define at least a portion of a thermally-conductive heat path at least partially around the perimeter defined by the plurality of sides of the memory foam core to the heat removal/dissipation structure.

In an exemplary embodiment, a device includes a heat source, the thermal interface material disposed along the heat source, and an enclosure. The heat source and the thermal interface material are slidably positionable within the enclosure while the resilient core is at least partially compressed to thereby avoid sliding contact of the graphite with the enclosure. Expansion of the resilient core will force the graphite into thermal contact with the enclosure whereafter the graphite will define at least a portion of a thermally-conductive heat path from the heat source at least partially around the perimeter defined by the plurality of sides of the resilient core to the enclosure.

In an exemplary embodiment, a method of providing a thermal management solution between a heat source and a heat removal/dissipation structure includes: compressing a memory foam core of a thermal interface material that is disposed along the heat source, the thermal interface material further including a heat spreader disposed at least partially around a perimeter defined by a plurality of sides of the memory foam core; aligning a portion of the heat spreader for thermal contact with a corresponding portion of the heat removal/dissipation structure while the memory foam core remains at least partially compressed to thereby avoid sliding contact of the thermal interface material with the heat removal/dissipation structure; and allowing the memory foam core to expand such that expansion of the compressed memory foam core thermally contacts the aligned portion of the heat spreader with the corresponding portion of the heat removal/dissipation structure, whereby the heat spreader defines at least a portion of a thermally-conductive heat path at least partially around the perimeter defined by the plurality of sides of the memory foam core to the heat removal/dissipation structure.

In this exemplary method, the heat spreader may comprise graphite. The memory foam core may be configured to retain a compressed shape and reduced thickness for a predetermined minimum amount of time and/or with less than twenty percent rebound for at least two minutes. The memory foam core may comprise a viscoelastic polyurethane foam, a low-resilience polyurethane foam, a gel-infused memory foam. The heat source may comprise a component mounted on a printed circuit board. The heat removal/dissipation structure may comprise an enclosure. The step of aligning the portion of the heat spreader for thermal contact with the corresponding portion of the heat removal/dissipation structure may include slidably positioning the component and the thermal interface material within the enclosure while the memory foam core remains at least partially compressed to thereby align a portion of the graphite with the corresponding portion of the enclosure while avoiding sliding contact of the graphite with the enclosure. The step of allowing the memory foam core to expand may include allowing the memory foam core to expand such that expansion of the compressed memory foam core thermally contacts the aligned portion of the graphite with the corresponding portion of the enclosure, whereby the graphite defines at least a portion of a thermally-conductive heat path at least partially around the perimeter defined the plurality of sides of the memory foam core to the enclosure. The method may further include adhesively attaching the thermal interface material to the heat source.

In an exemplary embodiment, a method of manufacturing a thermal interface material includes wrapping a heat spreader at least partially around a perimeter defined by a plurality of sides of a memory foam core. The heat spreader may comprise graphite. The memory foam core may comprise a viscoelastic polyurethane foam, a low-resilience polyurethane foam, a gel-infused memory foam. The memory foam core may be configured to retain a compressed shape and reduced thickness for a predetermined minimum amount of time and/or with less than twenty percent rebound for at least two minutes.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 3-9, or 3-8, it is also envisioned that Parameter X may have other ranges of values including 1-9, 1-8, 1-3, 1-3, 3-10, 3-8, 3-3, 3-10, and 3-9.

The terminology used herein is for the purpose of describing particular example embodiments only and is not intended to be limiting. For example, when permissive phrases, such as "may comprise", "may include", and the like, are used herein, at least one embodiment comprises or includes such feature(s). As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermal interface material comprising:
a memory foam core including a plurality of sides defining a perimeter; and
a heat spreader disposed at least partially around the perimeter defined by the plurality of sides of the memory foam core;
wherein the memory foam core is configured to be compressible such that the thermal interface material is slidably insertableable within an enclosure to align the heat spreader for thermal contact with the enclosure while the memory foam core remains compressed to thereby avoid sliding contact of the heat spreader with the enclosure, and expansion of the compressed memory foam core will force the heat spreader into thermal contact with the enclosure whereby the heat spreader will define at least a portion of a thermally-conductive conductive heat path at least partially around the perimeter defined by the plurality of sides of the memory foam core to the enclosure.

2. The thermal interface material of claim 1, wherein:
the memory foam core comprises a viscoelastic polyurethane foam, a low-resilience polyurethane foam, a gel-infused memory foam; and/or
the heat spreader comprises natural graphite and/or synthetic graphite.

3. The thermal interface material of claim 1, claim wherein the memory foam core is configured to be compressible into a compressed shape having a reduced thickness and to thereafter retain the compressed shape having the reduced thickness for a predetermined minimum amount of time and/or with less than twenty percent rebound for at least two minutes.

4. The thermal interface material of claim 1, wherein the heat spreader comprises a graphite sheet wrapped entirely around the perimeter defined by the plurality of sides of the memory foam core.

5. The thermal interface material of claim 1, wherein a portion of the memory foam core is disposed between upper and lower portions of the heat spreader along a leading edge of the thermal interface material, whereby the portion of the memory foam core intervenes between the upper and lower portions of the heat spreader along the leading edge of the thermal interface material and thereby inhibits direct abutting contact between the upper and lower portions of the heat spreader along the leading edge of the thermal interface material.

6. The thermal interface material of claim 1, wherein the heat spreader comprises graphite, such that the thermal interface material comprise a graphite over memory foam gasket.

7. The thermal interface material of claim 1, wherein the heat spreader comprises one or more of a graphite sheet, aluminum foil, and/or copper foil.

8. A thermal interface material comprising:
a memory foam core including a plurality of sides defining a perimeter; and
a heat spreader disposed at least partially around the perimeter defined by the plurality of sides of the memory foam core;
wherein the thermal interface material comprises:
a first portion with a generally rectangular cross-section or profile; and
a second opposite portion with a generally triangular cross-section or profile including a downwardly slanted top surface that provides the thermal interface material with a tapering leading edge.

9. The thermal interface material of claim 8, wherein the memory foam core is compressible such that a portion of the heat spreader is alignable with a corresponding portion of a heat removal/dissipation structure while the memory foam core remains compressed to thereby avoid sliding contact of the heat spreader with the heat removal/dissipation structure, and expansion of the compressed memory foam core will force the aligned portion of the heat spreader into thermal contact with the corresponding portion of the heat removal/dissipation structure whereby the heat spreader will define at least a portion of a thermally-conductive heat path at least partially around the perimeter defined by the plurality of sides of the memory foam core to the heat removal/dissipation structure.

10. A device including a heat source, a thermal interface disposed along the heat source, and an enclosure, wherein the thermal interface material comprises:
a memory foam core including a plurality of sides defining a perimeter, and
a heat spreader disposed at least partially around the perimeter defined by the plurality of sides of the memory foam core;
wherein the heat source and the thermal interface material are slidably insertable together within the enclosure while the memory foam core is at least partially compressed to thereby avoid sliding contact of the heat spreader with the enclosure, and expansion of the compressed memory foam core will force the heat spreader into thermal contact with the enclosure whereby the heat spreader will define at least a portion of a thermally-conductive heat path from the heat source at least partially around the perimeter defined by the plurality of sides of the memory foam core to the enclosure.

11. A thermal interface material comprising:
a resilient core including a plurality of sides defining a perimeter; and
a heat spreader disposed at least partially around the perimeter defined by the plurality of sides of the resilient core;
wherein the thermal interface material comprises:
a first portion with a generally rectangular cross-section or profile; and
a second opposite portion with a generally triangular cross-section or profile including a downwardly slanted top surface that provides the thermal interface material with a tapering leading edge portion that reduces in height along a direction from the first portion to the leading edge.

12. The thermal interface material of claim 11, wherein:
the resilient core comprises a memory foam core; and
the heat spreader comprises natural graphite and/or synthetic graphite.

13. The thermal interface material of claim 12, wherein the memory foam core is configured to be compressible into a compressed shape having a reduced thickness and to thereafter retain the compressed shape having the reduced thickness for a predetermined minimum amount of time and/or with less than twenty percent rebound for at least two minutes.

14. The thermal interface material of claim 12, wherein the memory foam core is compressible such that a portion of the graphite is alignable with a corresponding portion of a heat removal/dissipation structure while the memory foam core remains compressed to thereby avoid sliding contact of the graphite with the heat removal/dissipation structure, and expansion of the compressed memory foam core will force the aligned portion of the graphite into thermal contact with the corresponding portion of the heat removal/dissipation structure whereafter the graphite will define at least a portion of a thermally- conductive heat path at least partially around the perimeter defined by the plurality of sides of the memory foam core to the heat removal/dissipation structure.

15. A device including a heat source, a thermal interface material disposed along the heat source, and an enclosure, wherein the thermal interface material comprises:
a resilient core including a plurality of sides defining a perimeter; and
graphite disposed at least partially around the perimeter defined by the plurality of sides of the resilient core;
wherein the heat source and the thermal interface material are slidably insertable together within the enclosure while the resilient core is at least partially compressed to thereby avoid sliding contact of the graphite with the enclosure, and expansion of the resilient core will force the graphite into thermal contact with the enclosure whereafter the graphite will define at least a portion of a thermally-conductive heat path from the heat source at least partially around the perimeter defined by the plurality of sides of the resilient core to the enclosure.

16. A method comprising:
compressing a memory foam core of a thermal interface material that is disposed along a heat source, the thermal interface material further including a heat spreader disposed at least partially around a perimeter defined by a plurality of sides of the memory foam core;
aligning a portion of the heat spreader for thermal contact with a corresponding portion of a heat removal/dissipation structure while the memory foam core remains at least partially compressed to thereby avoid sliding contact of the thermal interface material with the heat removal/dissipation structure; and
allowing the memory foam core to expand such that expansion of the compressed memory foam core thermally contacts the aligned portion of the heat spreader with the corresponding portion of the heat removal/dissipation structure, whereby the heat spreader defines at least a portion of a thermally-conductive heat path at least partially around the perimeter defined by the plurality of sides of the memory foam core to the heat removal/dissipation structure;
wherein:
the heat spreader comprises graphite;
the heat source comprises a component mounted on a printed circuit board;
the heat removal/dissipation structure comprises an enclosure;
aligning the portion of the heat spreader for thermal contact with the corresponding portion of the heat removal/dissipation structure includes slidably positioning the component and the thermal interface material together within the enclosure while the memory foam core remains at least partially compressed to thereby align a portion of the graphite with the corresponding portion of the enclosure while avoiding sliding contact of the graphite with the enclosure; and
allowing the memory foam core to expand includes allowing the memory foam core to expand such that expansion of the compressed memory foam core thermally contacts the aligned portion of the graphite with the corresponding portion of the enclosure, whereby the graphite defines at least a portion of a thermally-conductive heat path at least partially around the perimeter defined by the plurality of sides of the memory foam core to the enclosure.

17. The method of claim 16, wherein:
the method further comprising adhesively attaching the thermal interface material to the heat source; and/or
the memory foam core is configured to retain a compressed shape and reduced thickness for a predetermined minimum amount of time and/or with less than twenty percent rebound for at least two minutes; and/or the heat spreader comprises graphite; and/or the memory foam core comprises a viscoelastic polyurethane foam, a low-resilience polyurethane foam, a gel-infused memory foam.

18. The thermal interface material of claim 1, wherein the memory foam core comprises a viscoelastic polyurethane foam configured to be compressible into a compressed shape having a reduced thickness and to thereafter retain the compressed shape having the reduced thickness for a predetermined minimum amount of time and with less than twenty percent rebound for at least two minutes.

19. The device of claim 10, wherein the memory foam core comprises a viscoelastic polyurethane foam configured to be compressible into a compressed shape having a reduced thickness and to thereafter retain the compressed shape having the reduced thickness for a predetermined minimum amount of time and with less than twenty percent rebound for at least two minutes.

20. The thermal interface material of claim 11, wherein the resilient core comprises a viscoelastic polyurethane foam configured to be compressible into a compressed shape having a reduced thickness and to thereafter retain the compressed shape having the reduced thickness for a predetermined minimum amount of time and with less than twenty percent rebound for at least two minutes.

* * * * *